United States Patent [19]

Nowlan

[11] Patent Number: 5,076,857
[45] Date of Patent: Dec. 31, 1991

[54] PHOTOVOLTAIC CELL AND PROCESS

[75] Inventor: Michael J. Nowlan, Arlington, Mass.

[73] Assignee: Spire Corporation, Bedford, Mass.

[21] Appl. No.: 573,467

[22] Filed: Aug. 27, 1990

[51] Int. Cl.$^5$ .................... H01L 31/04; H01L 31/18
[52] U.S. Cl. .................................. 136/256; 136/259; 437/2
[58] Field of Search ................. 136/256, 259; 437/2–5

[56] References Cited

U.S. PATENT DOCUMENTS

| | | | |
|---|---|---|---|
| 4,053,327 | 10/1977 | Meulenberg, Jr. | 136/256 |
| 4,069,812 | 6/1978 | O'Neill | 136/246 |
| 4,285,714 | 8/1981 | Kirkpatrick | 65/40 |
| 4,348,546 | 9/1982 | Little | 136/256 |
| 4,379,202 | 4/1983 | Chalmers | 136/256 |
| 4,380,112 | 4/1983 | Little | 437/2 |
| 4,392,297 | 7/1983 | Little | 437/5 |
| 4,450,033 | 5/1984 | Little | 156/380.8 |
| 4,509,248 | 4/1985 | Spitzer et al. | 437/2 |
| 4,608,451 | 8/1986 | Landis | 136/256 |
| 4,620,364 | 11/1986 | Landis | 437/2 |
| 4,711,972 | 12/1987 | O'Neill | 136/246 |
| 5,019,176 | 5/1991 | Brandhorst, Jr. et al. | 136/244 |

OTHER PUBLICATIONS

M. J. O'Neill et al., *Conference Record, 20th IEEE Photovoltaic Specialists Conference* (1988), pp. 1007–1012.
J. Zhao et al., *Conference Record, 20th IEEE Photovoltaic Specialists Conference* (1988), pp. 529–531.

Primary Examiner—Aaron Weisstuch
Attorney, Agent, or Firm—Morse, Altman, Dacey & Benson

[57] ABSTRACT

An improved photovoltaic cell and a process of making it are disclosed. Essentially, the process merges the technology of ESB with the phenomenon of total internal reflection to provide a photovoltaic cell of improved conversion efficiency and comprising a solar cell formed of a semiconductor material and provided with a front contact, a cover plate formed of a glass having a thermal expansion coefficient matching that of the semiconductor material, with the back surface of the cover plate provided with a plurality of V-grooves overlying the front contact and being electrostatically bonded to the solar cell. The V-grooves serve both as clearance slots for the front contact and its converging facets as reflecting surfaces to direct incident light onto the cell's surfaces in between the front contact grid lines.

11 Claims, 2 Drawing Sheets

PHOTOVOLTAIC CELL AND PROCESS

BACKGROUND OF THE INVENTION

1. Field of the Invention

The present invention relates generally to photovoltaic cells and, more particularly, to an improved photovoltaic cell that combines the technology of electrostatic bonding with total internal reflection to provide a cell assembly with improved conversion efficiency.

2. The Prior Art

Solar cells generally are formed with a front surface partially covered by thin front contact grid lines, also referred to as front surface metallization. The front surface metallization of a solar cell must satisfy several conflicting requirements, such as: (1) the metal coverage of the front surface of the solar cell must be low in order to minimize losses due to the shadowing of the cell surface; (2) the distance from any point on the cell front surface to the nearest metallization element must be short in order to minimize sheet resistance losses in the front surface layer; (3) resistance along the metal grid lines and the conductor bus must be low; and (4) contact resistance between the metallization element and the semiconductor front surface must be low in order to minimize power losses due to these resistances.

One attempt at solving the problem of illumination blocked by the grid lines of the front surface metallization for use with flat plate solar cells involved the provision of a plurality of converging lenses which concentrate the illumination onto the active cell areas rather than being reflected from the front surface metallization. See U.S. Pat. No. 4,053,327, issued to Meulenberg, Jr. on Oct. 11, 1977. These plurality of converging lenses are formed in a plastic or glass cover slide for terrestrial use or formed in glass, fused silica, quartz or sapphire for space applications, and is shown attached to the top surface of the solar cell by a layer of adhesive.

Another attempt at solving the problem of blocked illumination by the grid lines of the front surface metallization for use with optical concentrators, such as involving the use of Fresnel lenses, included the application of a flexible cell cover formed of an optically clear, flexible material, such as a silicone polymer. A plurality of prisms are formed in the outer surface of the cell cover such that the incident illumination is refracted by the prisms onto the active cell areas rather than onto the metallic conducting elements. See the U.S. Pat. No. 4,711,972, granted to O'Neill on Dec. 8, 1987.

The former Meulenberg design, when exposed to environmental conditions, has performed below expectations. It was also expensive to manufacture. Additionally, the cover tended to become misaligned due to mismatch in the thermal expansion coefficients between the cover material and the cell material, degrading its performance. The latter O'Neill design, on the other hand, using the flexible silicone polymer tends to degrade over time due to exposure to ultraviolet and charged particle radiation, as well as due to mechanical erosion.

There is thus room for improvement in the construction of photovoltaic cells.

SUMMARY OF THE INVENTION

It is the principal object of the present invention to overcome the above disadvantages by providing a photovoltaic cell of improved conversion efficiency and a cost-effective method for making the same.

More specifically, it is an object of the present invention to provide an improved photovoltaic cell and a process for making it that merges the technology of electrostatic bonding (ESB) with the phenomenon of total internal reflection (TIR) to provide a photovoltaic cell comprising a solar cell formed of a semiconductor material and having a front contact grid, a cover plate formed of a glass material with a thermal expansion coefficient matching that of the semiconductor material, with the back side of the cover plate provided with a plurality of V-grooves overlying the front contact grid and being electrostatically bonded to the solar cell. The V-grooves serve both as clearance slots for the front contact grid and its converging facets as reflecting surfaces for TIR, directing all incident radiation onto the solar cell's active surface in between the front contact grid. Preferably, the semiconductor material is silicon, gallium arsenide, indium phosphide or any other suitable photovoltaic material. Preferably, the facets forming the V-grooves converge at a predetermined angle so as to achieve TIR. If desired, the facets are provided with a layer of reflective material. Preferably, either or both of the cell's and of the cover plate's front surface is provided with an antireflective coating. Preferably, the V-grooves are formed by pressing a heated metal die plate provided with a plurality of ridges representing a contoured mirrored image of the front contact grid into the back surface of the cover plate to form the V-grooves.

Other objects of the present invention will in part be obvious and will in part appear hereinafter.

The invention accordingly comprises the improved photovoltaic cell and the process of its manufacture of the present disclosure, its components, parts and their interrelationship, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENT

Generally, the present invention provides an improved photovoltaic cell of high conversion efficiency and a cost-effective process of making the same that combines the technology of electrostatic bonding (ESB) with the optical phenomenon of total internal reflection (TIR). ESB is essentially an adhesive-free direct bonding process in which a strong chemical bond is effected between the two adjacent surfaces attached thereby. TIR on the other hand is an optical phenomenon in which radiation in a given medium (say, optical fibers) incident on the boundary thereof with a less-dense medium (i.e., one having a lower index of refraction) at an angle less than the critical angle is completely reflected from the boundary.

As mentioned, the front surface metallization of a solar cell must satisfy several conflicting requirements, such as: (1) the metal coverage of the front surface of the solar cell must be low in order to minimize losses due to the shadowing of the cell surface; (2) the distance from any point on the cell front surface to the nearest metallization element must be short in order to minimize sheet resistance losses in the front surface layer; (3) resistance along the metal grid lines and the conductor bus must be low; (4) contact resistance between the metallization element and the semiconductor front surface must be low in order to minimize power losses due to these resistances.

These conflicting requirements are best satisfied, in a conventional solar cell, by a front metallic grid pattern comprising many fine, thin grid lines rather than fewer wider lines. The power losses in a solar cell due to the several resistances and the shadowing can be derived from power criteria. With the aid of these criteria, the size and shape of the grid pattern can be optimized.

Figure 1:
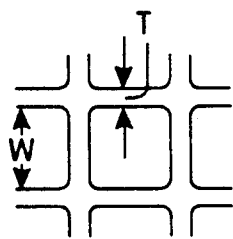
FIG. 1 is a schematic diagram of a representative front contact grid helpful in understanding the invention.

A schematic diagram of an optimized metallization element unit cell for a conventional solar cell is depicted in FIG. 1.

The unit shown is square, although a rectangular pattern or parallel line pattern may be preferred in some applications. In the unit cell shown in FIG. 1 the letter "T" denotes the thickness in cm of the grid line, which thickness is assumed to be equal to its width. The letter "W", on the other hand, denotes the width of the open area, also in cm. This width of the open area is, of course, determined by the grid line spacing per cm. The fraction of power lost (Pshadow) in a solar cell due to the shadowing of the solar cell area is best expressed by the fractional cell area that is covered: $P_{shadow} = 2T/W$. The total fraction of solar cell power lost is the sum of the fractional power losses due to sheet resistance, grid line and conductor bus resistances, and contact resistance, in addition to the above-mentioned shadowing. Assuming zero contact resistance, Air Mass 1 (AM1) intensity and values for a silver (Ag) grid pattern on a 10 cm$^2$ unit cell, the global optimum grid parameters are: $W = 0.185$ cm and $T = 29.4$ mm; and the resulting total power loss is about 5.59 percent. [Maximum light on the ground at sea level is called Air Mass 1; its intensity is 1 kWm$^{-2}$. In high mountains, the intensity increases to 1.1 kWm$^{-2}$. Solar light outside the atmosphere is called Air Mass 0 (AM0); its intensity is about 1.38 kWm$^{-2}$. The maximum theoretical conversion efficiency of a conventional silicon solar cell under maximum illumination with solar radiation on the ground is about 28 percent].

The present invention is directed to improve the conversion efficiency of solar cells occasioned by loss of illumination due to the front contact grid lines by providing a cover plate whose back surface is formed with a plurality of V-grooves denoted by smooth facets converging at an angle and overlying the front contact. Incident light, which otherwise would be shadowed by the front contact, is now reflected in toto by these facets and due to TIR onto the active area of the cell.

Meulenberg, Jr., in his U.S. Pat. No. 4,053,327, discloses a glass cover slide for a solar cell in which a plurality of converging lenses are formed in the top surface of the slide to refract incident light away from the gridlines and onto active cell areas. For reasons not well understood, Meulenberg's solar cells were found wanting in applications. One reason probably was due to the misalignment of the cover due to a severe mismatch of the thermal expansion coefficients of the glass cover slide and the semiconductor solar cell. Such misalignment has, of course, adversely affected cell performance. Another reason probably was due to economics in manufacturing the glass cover slide with the plurality of converging lenses and securing the same, properly aligned with the front contact, to the solar cell's surface. Another worker in the field, O'Neill, U.S. Pat. No. 4,711,972, also has addressed the problem of optical losses due to front contact shadowing. O'Neill's solution has included the provision of a flexible cell cover comprising an optically clear and flexible material, such as a silicone polymer, positioned over the illuminated surface of each solar cell. The optically clear and flexible material is provided with a plurality of prisms formed in its outer surface whereby incident radiation is refracted by the prisms onto the active cell surface.

By replacing Meulenberg's rigid glass cover plate with a flexible material, O'Neill both gained and lost some ground. He addressed the coefficient mismatch and some other shortcomings. O'Neill's solar energy collector, for instance, is less resistant to ultraviolet radiation, to charged particle radiation and, of course, to mechanical abrasion. On the other hand, presumably the formation of a plurality of prisms to exact specifications makes O'Neill's solar cells expensive to manufacture.

Figure 2:
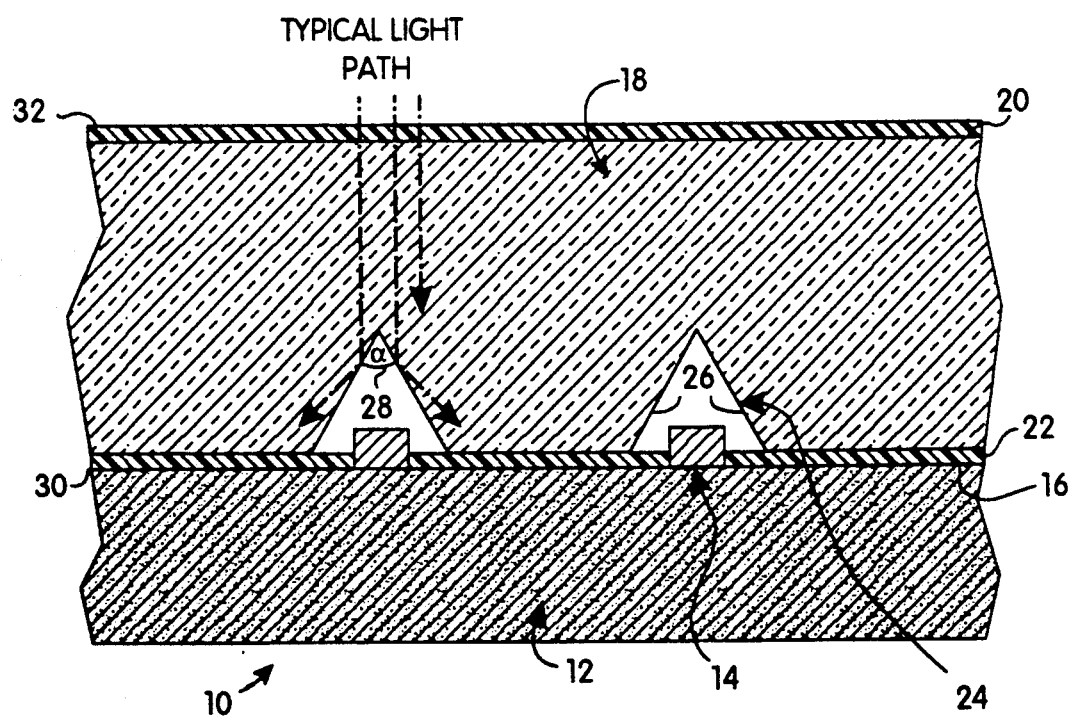
FIG. 2 is a schematic vertical cross-section, on an enlarged scale, of a fraction of a photovoltaic cell constructed in accordance with the invention.

In general, the illustrated preferred embodiment (see FIG. 2) of a photovoltaic cell 10 comprises a solar cell 12 formed of a suitable semiconductor material, a front contact grid 14 formed on a top surface 16 of the solar cell 12 in a predetermined pattern, and a cover plate 18 formed of a glass material between parallel front and back surfaces 20 and 22 and provided with a plurality of V-grooves 24 formed in the back surface 22 and mirroring the predetermined pattern of the front contact grid 14 and overlying the same. The back surface 22 of the cover plate 18 is electrostatically bonded (ESB) to the front surface 16 of the solar cell 12. The glass material forming the cover plate 18 possesses a thermal expansion coefficient which matches that of the semiconductor material forming the solar cell 12. Such glass is made by Pilkington Space Technology, Ltd., of Wales, United Kingdom and, for a silicon semiconductor material, is their type CMZ glass; for a gallium-arsenide semiconductor material, it is their type CMG glass. Each of the plurality of V-grooves 24 is formed with facets 26 converging at a predetermined angle 28. The determination and the significance of this groove angle 28 will be more fully disclosed below.

If desired, either the top surface 16 of the solar cell 12 or the front surface 20 of the cover plate 18, or both surfaces 16 and 20, can be provided with a suitable antireflective coating layer 30 and 32, respectively. One representative antireflective coating layer is magnesium fluoride, $MgF_2$.

As mentioned, the photovoltaic cell 10 of the invention and the process of making it essentially merge the technology of ESB and the optical phenomenon of TIR to produce an improved cell 10 with a conversion efficiency of about 20% to about 30% and in a cost-effective manner. As known, ESB is an electric field-assisted method for sealing glass to metals, semiconductors or dielectrics. In general, electrostatic bonding involves heating the glass to a temperature at which ionic conduction within the glass can take place. This is followed by applying a strong electric field across the glass and the material to be sealed. Under the influence of the electric field, mobile positive ions within the glass are caused to move away from the glass-semiconductor interface as this charge redistribution occurs. Where the glass and semiconductor surfaces are not in contact, the applied voltage appears across the gap separating these surfaces. The resulting electrostatic forces pull the closely spaced glass and semiconductor surfaces together, permitting thereby the establishment of the polarization layer along the entire glass-semiconductor interface. Once the polarization layer at this interface is fully established, a chemical bond is formed between the oxygen ions in the depleted region of the glass and the positive ions in the semiconductor material. This chemical bond is permanent. See U.S. Pat. Nos. 4,348,546, 4,380,112 and 4,450,033, all granted to Roger G. Little, and entitled "Front Surface Metallization and Encapsulation of Solar Cells," and assigned to the common assignee herein, Spire Corporation of Bedford, Mass., the disclosures of which are incorporated herein by reference. See also U.S. Pat. No. 4,509,248, Spitzer et al., "Encapsulation of Solar Cells;" U.S. Pat. No. 4,285,714, Allen R. Kirkpatrick, "Electrostatic Bonding Using Externally Applied Pressure;" U.S. Pat. No. 4,608,451, Geoffrey A. Landis, "Cross-Grooved Solar Cell," and U.S. Pat. No. 4,620,364, Landis, "Method of Making a Cross-Grooved Solar Cell," each of which is assigned to the common assignee herein, Spire Corporation of Bedford, Mass., and the disclosures of which also are incorporated herein by reference.

The optical phenomenon TIR employed herein is the same phenomenon which has been so successfully applied for transmitting electromagnetic radiation in optical data transmission systems at high speed and with minimum losses. See U.S. Pat. No. 4,475,790 issued to Roger G. Little, entitled "Fiber Optic Coupler," and also assigned to the common assignee, Spire Corporation, Bedford, Mass.

Figure 3:
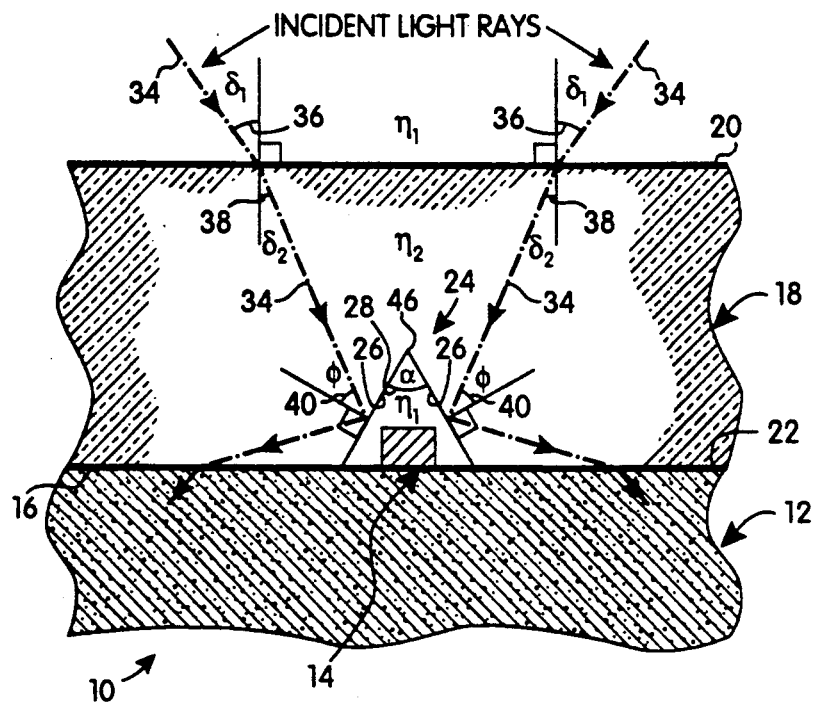
FIG. 3 is a schematic diagram of the fraction of photovoltaic cell of FIG. 2 illustrating certain principles helpful in understanding the invention.

The geometry for TIR from the photovoltaic cell 10 featuring a cover plate 18 with a plurality of V-grooves 24 is illustrated in FIG. 3. Light rays 34 incident on the front surface 20 of the glass cover plate 18 at a first angle 36 to the normal are refracted upon entering the glass cover plate 18 to a second angle 38. The refracted light rays 34 then strike the respective facets 26, 26 of the V-groove 24 at a third angle 40 normal to the plane of the facets 26, 26. TIR occurs at the facets 26, 26 when this third angle 40 is at least equal to or greater than the critical angle as given by the Equation 1:

$$n_2 \sin \text{angle } 40 = 1 \tag{1}$$

where $n_2$ denotes the index of refraction of the glass material forming the cover plate 18. For a glass material whose index of refraction is $n = 1.5$, the critical angle for the third angle 40 works out to be 41.81°. Thus, light with an angle 40 of at least 41.81° will result in TIR. The second angle 38, which is the refraction angle, is determined geometrically by the Equation 2:

$$\text{angle } 38 = \frac{\pi}{2} - \text{angle } 40 - \frac{\text{angle } 28}{2} \tag{2}$$

where angle 28 represents the angle of convergence of the facets 26, 26 of the V-groove 24. Once the angle 38, i.e., the refraction angle is ascertained, the first angle 36 can be derived from Snell's law of refraction, Equation 3, as follows:

$$n_1 \sin \text{angle } 36 = n_2 \sin \text{angle } 38 \tag{3}$$

where $n_1$ represents the index of refraction of air; $n_1 = 1.0$, and $n_2$ is the index of refraction of the glass material forming the cover plate 18, $n_2 = 1.5$, typically. If the groove convergence angle 28 is equal to 45°, then the light rays 34 striking the surface 20 of the cover plate 18 with angles less than or equal to 40.56° will reflect by TIR whenever the refracted ray 34 strikes the facet 26 of the groove 24.

Since $n_1$ generally is air or vacuum, it equals 1.0, and since $n_2$ is determined by the glass material, the main variable is represented by the groove convergence angle 28. For, as the groove angle 28 becomes progressively smaller, an ever wider range of incident light angles 36 will be reflected off the facets 26, 26 by TIR. This is illustrated in FIG. 4.

Figure 4:
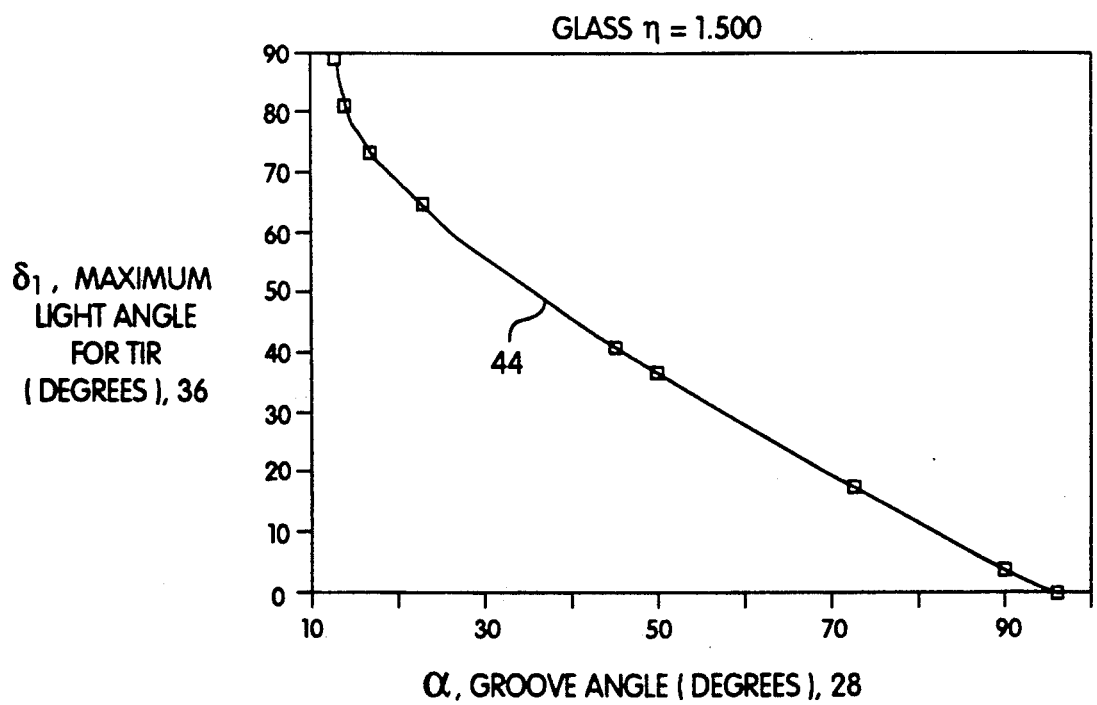
FIG. 4 is a schematic diagram also helpful in understanding the invention.

In FIG. 4, a curve 44 plots the maximum incident light angle 36 against the groove convergence angle 28, with $n_1$ being equal to 1.0 and $n_2$ being 1.5. Observation of the curve 44 clearly indicates that narrow groove convergence angles 28 are preferred as being more effective for TIR than wide groove convergence angles 28.

Another design consideration in shaping the V-grooves 24 pertains to the radius of the vertex 46 thereof, which radius must be small when compared to the width of the grid line of the front contact grid 14. This is so since light incident on the vertex 46 will either enter the V-groove 24 and thus will strike the grid 14 or the light will be reflected by the vertex 46 directly toward the front surface 20 of the cover plate 18.

A further design consideration involves the facets 26, 26 of each of the plurality of V-grooves 24. For effective utilization of the facets 26, 26 for TIR, they must be as smooth as practicable. Further, the facets 26, 26 also can be metallized to enhance reflection. Such metallization of the facets 26, 26 can take the form of providing them with a thin film of reflective material (not shown) immediately after the plurality of V-grooves 24 are formed. The reflective material can be aluminum or silver or the like. Metallization of the facets 26, 26 of the plurality of V-grooves 24 transforms the facets 26, 26 into polished mirrors, allowing thereby reflection of incident light rays 34 at ever wider groove convergence angles 28 than is possible without the presence of the reflective film materials. The thin film of reflective material can be deposited into the V-grooves 24 in any known manner such as, for example, by a vacuum evaporation process and removed from the flat (non-groove) surface 22 of the glass cover plate 18 by mechanical means, such as polishing or abrading, or by a photolithography and etching process.

The process of making the photovoltaic cell 10 includes the steps of forming a solar cell 12 from a suitable semiconductor material such as silicon, gallium-arsenide, indium phosphide or other suitable photovoltaic material; providing a front contact grid 14 of a predetermined pattern on the front surface 16 of the solar cell 12; forming a cover plate 18 with parallel front 20 and back 22 surfaces of a glass material having a thermal expansion coefficient matching that of the particular semiconductor material forming the solar cell 12. The plurality of V-grooves 24 are formed into the back surface 22 of the glass cover plate 18 preferably with the aid of a metal die plate (not shown) whose surface is formed with a plurality of ridges representing a contoured image of the predetermined pattern of the front contact grid 14 on the solar cell 12. The metal die plate is heated to a temperature above the glass softening point and then pressed with its contoured surface into the back surface 22 of the glass cover plate 18. The facets 26, 26 of the now formed V-grooves 24 are then coated with the film of reflective material by the vacuum evaporation process mentioned above, if metallization of the V-grooves 24 is desired. Further, the top surface 16 of the solar cell 12 and/or the front surface 20 of the cover plate 18 are then provided with suitable antireflective coatings 30 and 32, as desired. The grooves 24 are, of course, formed with the predetermined converging angle 28, as above explained. Otherwise, the grooves 24 preferably are shallow, typically being about 0.03 mm deep.

Thus it has been shown and described an improved photovoltaic cell 10 and a cost-effective method of making it, which cell and method satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. An improved photovoltaic cell comprising:
   (a) a solar cell formed of a semiconductor material having a front surface and a back surface;
   (b) a front contact grid of a predetermined pattern provided on said front surface of said solar cell;
   (c) a cover plate formed of a glass material having parallel front and back surfaces and a thermal expansion coefficient matching that of said semiconductor material;
   (d) said back surface of said cover plate provided with a plurality of V-grooves each formed with facets diverging at a predetermined angle toward a base located at said back surface of said cover plate and mirroring said predetermined pattern of said front contact grid;
   (e) said back surface of said cover plate being electrostatically bonded to said front surface of said solar cell;
   (f) said V-grooves serving as clearance slots for said front contact grid such tat said grid is fully contained therein by projecting into said V-grooves from their said respective bases, and said diverging facets thereof serving as reflecting surfaces for light rays incident on said front surface of said cover plate to direct said rays onto said front surface of said solar cell in between said front contact grid;
   (g) said diverging facets being provided with a layer of reflective material.

2. The photovoltaic cell of claim 1 wherein said semiconductor material is one of a group consisting of silicon, gallium arsenide, and indium phosphide, and wherein said predetermined angle is less than about 50°.

3. The photovoltaic cell of claim 1 wherein each of said plurality of V-grooves is formed with a vertex whose radius is smaller than the shortest width of a grid line forming said front contact grid.

4. The photovoltaic cell of claim 1 wherein said reflective material is one of a group consisting of aluminum and silver.

5. The photovoltaic cell of claim 1 wherein said front surface of said cover plate is provided with an antireflective coating, and wherein said front contact grid is relatively wide to reduce power loss without significant additional shadow loss due to reflection of light from said plurality of V-grooves, and wherein said front surface of said solar cell also is provided with an antireflective coating before said cover plate is electrostatically bonded thereto, and wherein said plurality of V-grooves have a depth from about 0.02 mm to about 0.05 mm.

6. A process of making a photovoltaic cell comprising:
   (a) forming a solar cell from a semiconductor material, including providing a front contact grid of a predetermined pattern on a front surface thereof;
   (b) forming a cover plate with parallel front and back surfaces of a glass material having a thermal expansion coefficient matching that of said semiconductor material;
   (c) forming a metal die plate with a surface provided with a plurality of ridges representing a contoured mirror image of said predetermined pattern of said front contact grid;
   (d) heating said metal die plate to a temperature above the softening point of said glass material;
   (e) pressing said contoured surface of said heated metal die into said back surface of said cover plate to form a plurality of V-grooves therein with facets diverging at a predetermined angle toward a base located at said back surface of said cover plate; and
   (f) electrostatically bonding said back surface of said cover plate to said front surface of said solar cell so that said plurality of V-grooves overlie said front contact grid, with said grid fully contained therein by projecting into said V-grooves from their said respective bases.

7. The process of claim 6 wherein said semiconductor material is one of a group consisting of silicon, gallium arsenide, and indium phosphide.

8. The process of claim 6 wherein said predetermined angle is less than about 50°, said converging facets are smooth, and wherein said converging facets are provided with a layer of reflective material.

9. The process of claim 8 wherein said reflective material is one of a group consisting of aluminum and silver, and wherein each of said plurality of V-grooves is formed with a vertex whose radius is smaller than the shortest width of a grid line forming said front contact grid.

10. The process of claim 6 further including providing said front surface of said cover plate with an antireflective coating.

11. The process of claim 10 further including providing said front surface of said solar cell with an antireflective coating.

* * * * *